United States Patent
Chung et al.

(10) Patent No.: US 11,903,332 B2
(45) Date of Patent: Feb. 13, 2024

(54) SUPERCONDUCTOR COMPRISING MAGNESIUM DIBORIDE AND MANUFACTURING METHOD THEREFOR

(71) Applicant: KOREA INSTITUTE OF MACHINERY & MATERIALS, Daejeon (KR)

(72) Inventors: Kook Chae Chung, Changwon-si (KR); Young Seok Oh, Busan (KR); Seong Hoon Kang, Changwon-si (KR); Kiran Prakash Shinde, Changwon-si (KR); Mahipal Ranot, Changwon-si (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 806 days.

(21) Appl. No.: 16/962,923

(22) PCT Filed: Feb. 6, 2018

(86) PCT No.: PCT/KR2018/001570
§ 371 (c)(1),
(2) Date: Jul. 17, 2020

(87) PCT Pub. No.: WO2019/156259
PCT Pub. Date: Aug. 15, 2019

(65) Prior Publication Data
US 2021/0036207 A1    Feb. 4, 2021

(51) Int. Cl.
*H10N 60/85*    (2023.01)
*C01B 7/01*    (2006.01)
(Continued)

(52) U.S. Cl.
CPC ............... *H10N 60/85* (2023.02); *C01B 7/01* (2013.01); *C01B 35/04* (2013.01); *H10N 60/0856* (2023.02); *H10N 60/20* (2023.02)

(58) Field of Classification Search
CPC .......... H10N 60/85; H10N 60/20; C01B 7/01; C01B 35/04
See application file for complete search history.

(56) References Cited

U.S. PATENT DOCUMENTS

2021/0104657 A1*   4/2021   Chung .................. H10N 60/85

FOREIGN PATENT DOCUMENTS

| JP | 2001101936 | 4/2001 |
|----|------------|--------|
| JP | 2005001903 | 1/2005 |

(Continued)

OTHER PUBLICATIONS

Kovac et al. "Properties of MgB2 wires made by internal magnesium diffusion into different boron powders." Supercond. Sci. Technol. 28 (2015) 095014 (Year: 2015).*

(Continued)

*Primary Examiner* — Paul A Wartalowicz
(74) *Attorney, Agent, or Firm* — LEX IP MEISTER, PLLC

(57) ABSTRACT

The present disclosure relates to a superconductor including magnesium diboride and a production method therefor. A superconductor having a high critical current density at a certain temperature and under a certain magnetic field may be obtained by doping magnesium diboride with liquid chloroform during the production of the superconductor.

8 Claims, 6 Drawing Sheets

(51) Int. Cl.
  *C01B 35/04*    (2006.01)
  *H10N 60/20*    (2023.01)
  *H10N 60/01*    (2023.01)

(56) References Cited

FOREIGN PATENT DOCUMENTS

| | | |
|---|---|---|
| JP | 2007095367 | 4/2007 |
| JP | 2008110883 | 5/2008 |
| JP | 2010192142 | 9/2010 |
| JP | 2013016396 | 1/2013 |
| KR | 10-2011-0093809 | 8/2011 |
| WO | 2012090236 | 7/2012 |
| WO | 2018101496 | 6/2018 |

OTHER PUBLICATIONS

KIPO, Office Action of KR 10-2018-7006230 dated Nov. 18, 2019.

* cited by examiner

[FIG. 1]
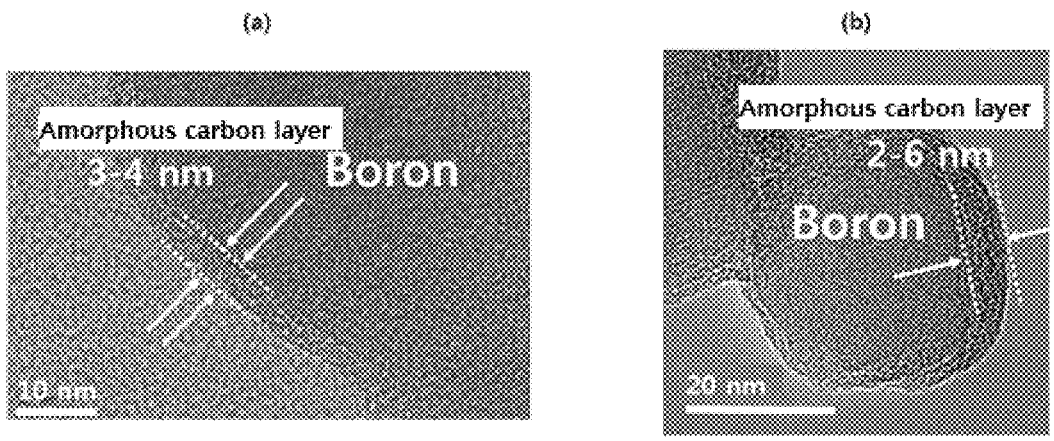
[FIG. 2a]
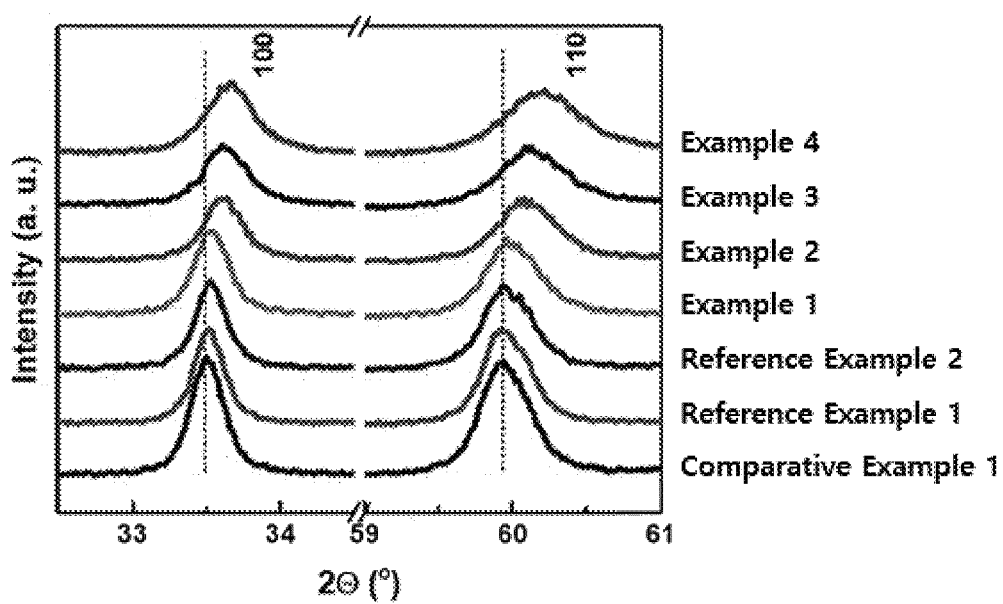

[FIG. 2b]
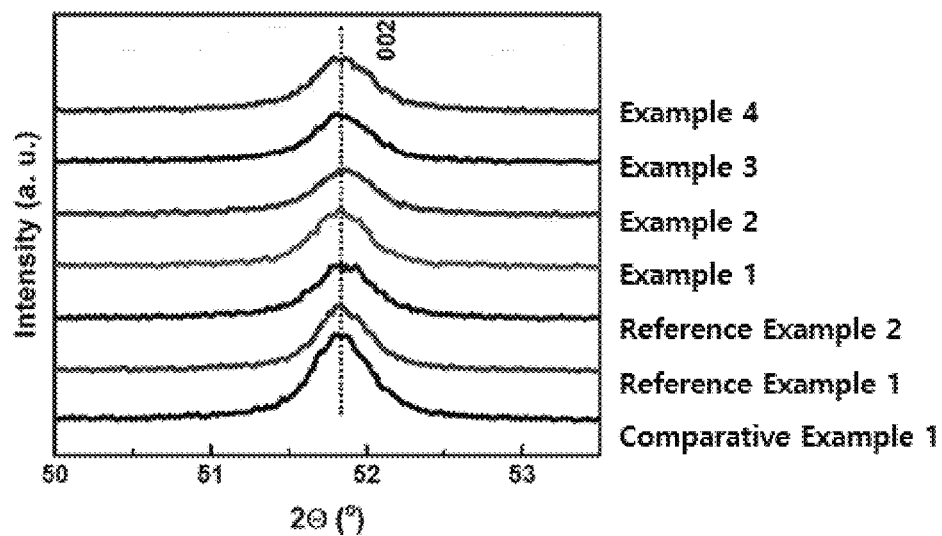
[FIG. 3]
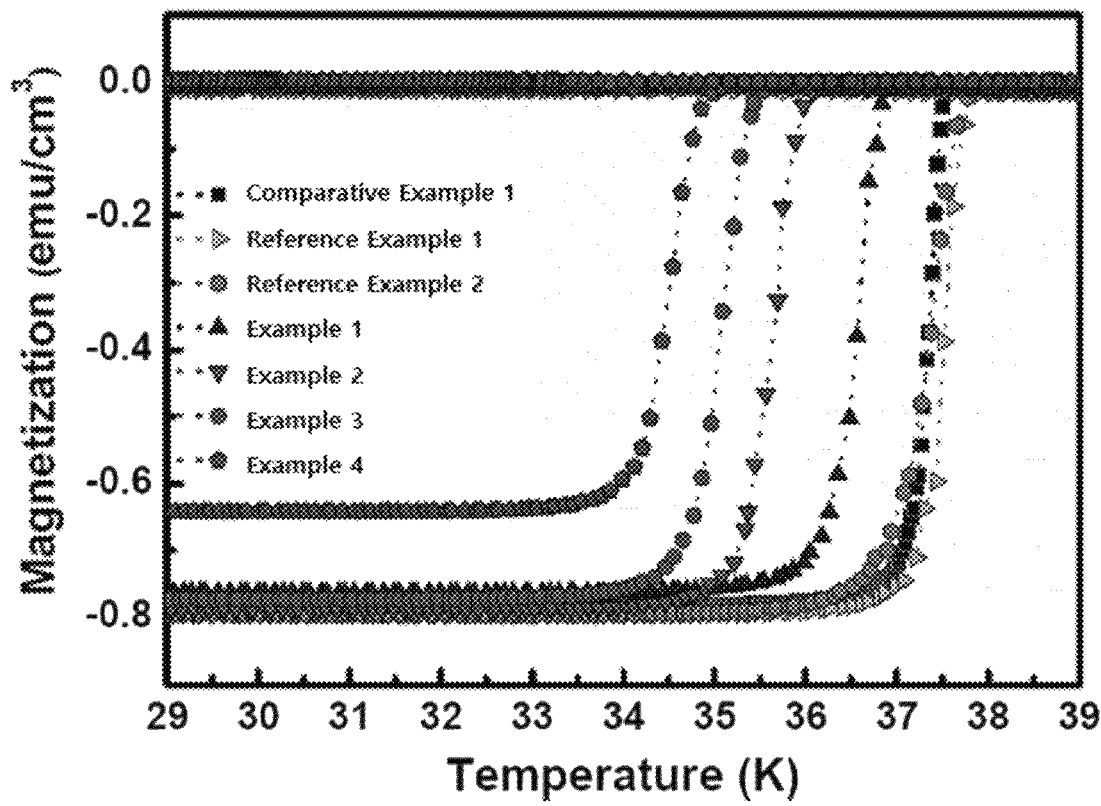

[FIG. 4]
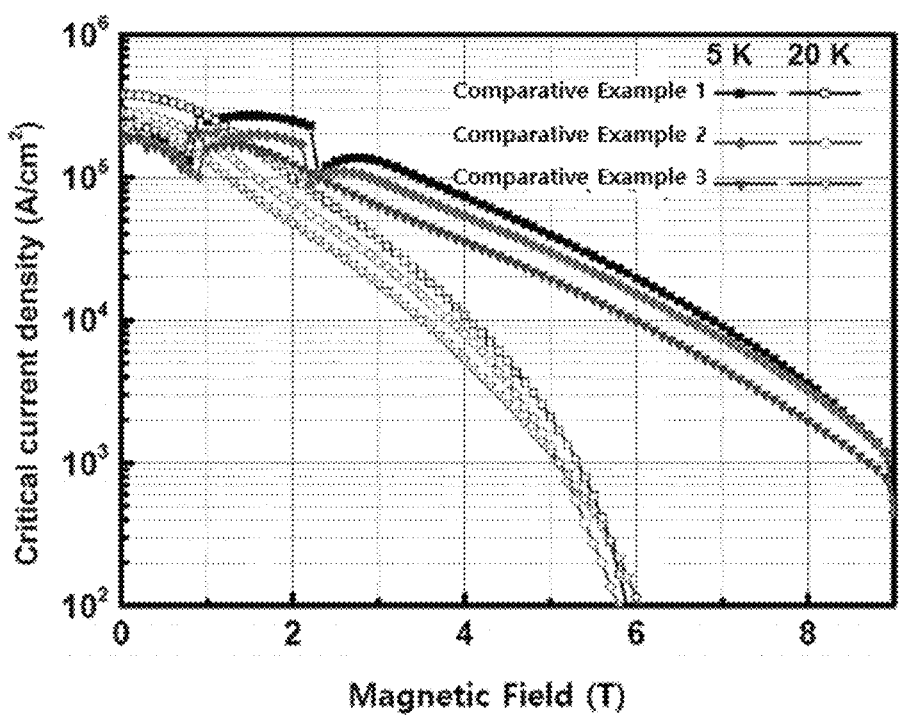

[FIG. 5a]
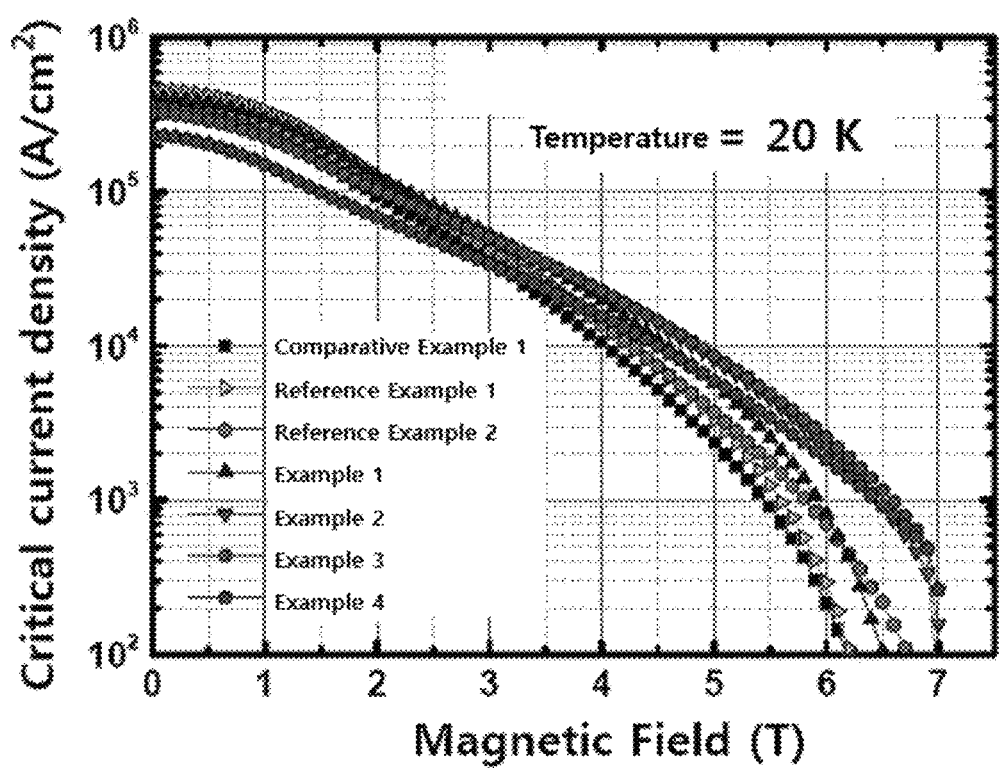

[FIG. 5b]
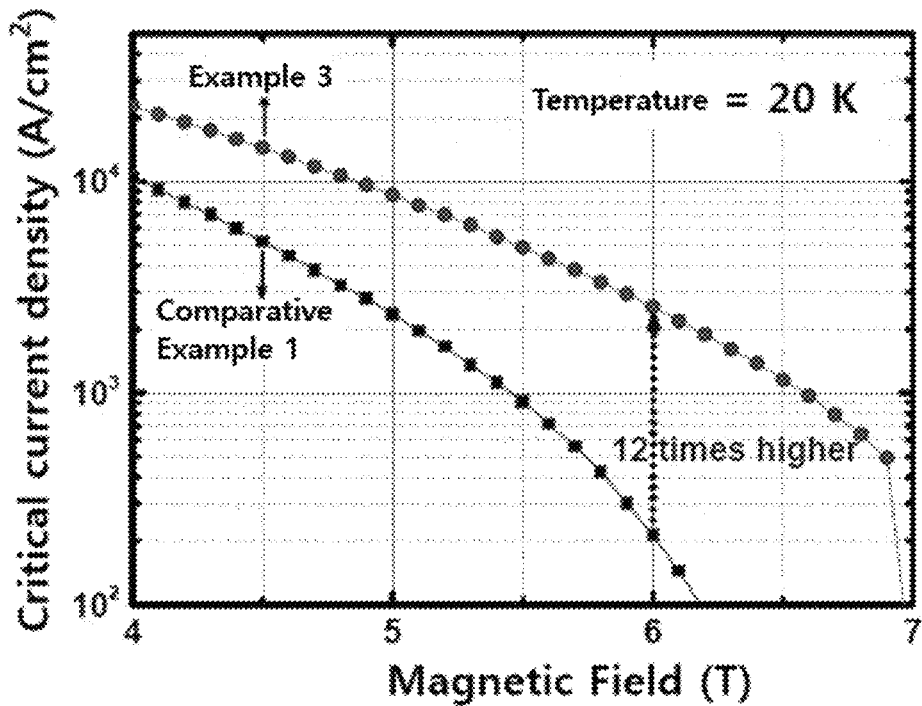
[FIG. 6a]
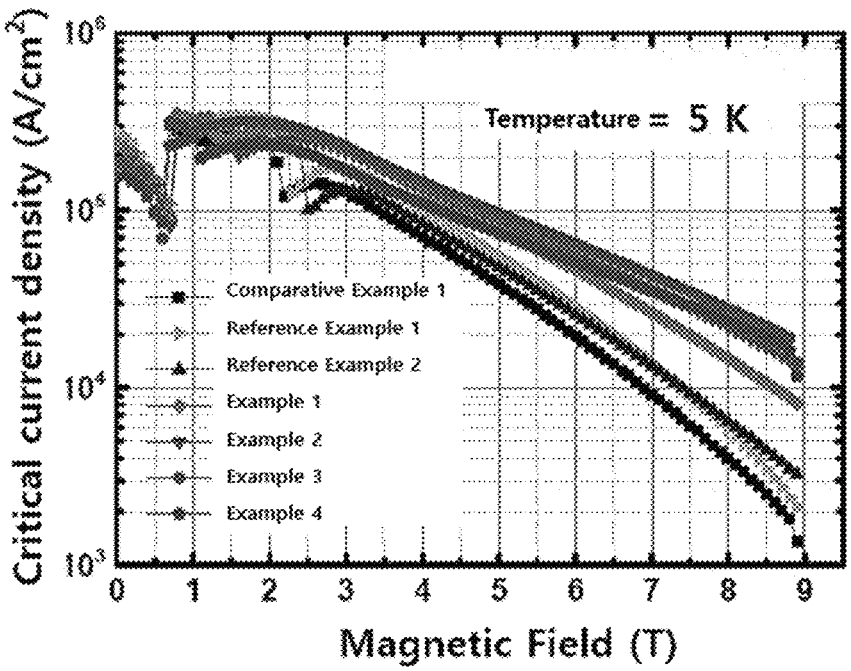

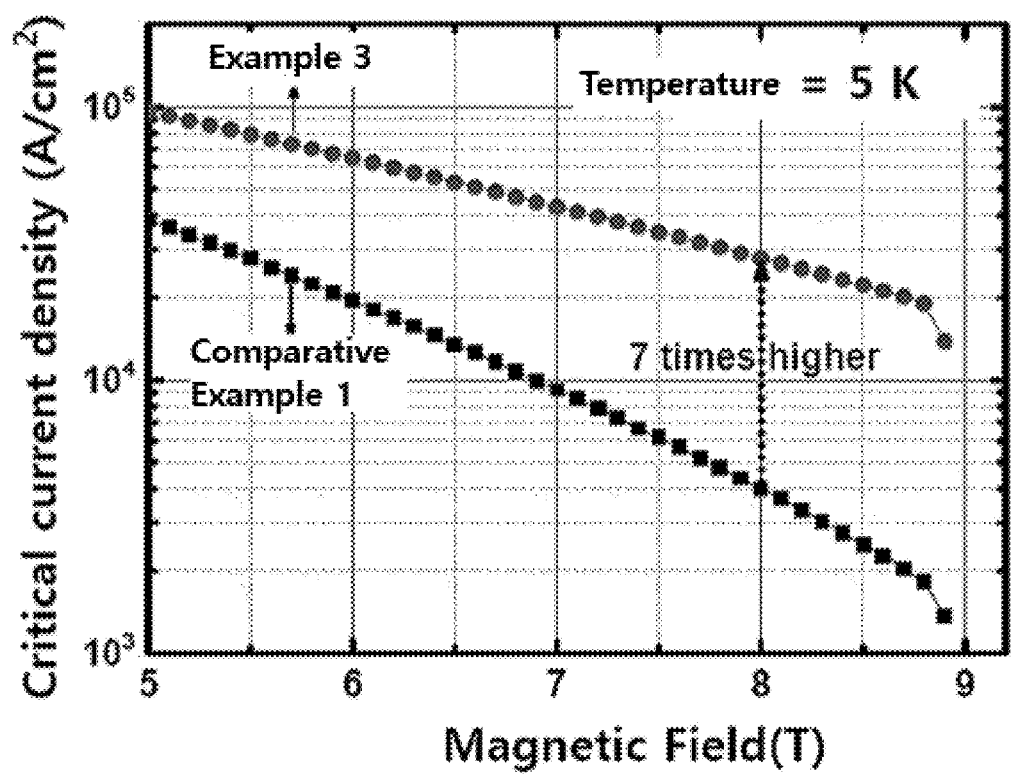
[FIG. 6b]

SUPERCONDUCTOR COMPRISING MAGNESIUM DIBORIDE AND MANUFACTURING METHOD THEREFOR

TECHNICAL FIELD

The present disclosure relates to a superconductor including magnesium diboride and a production method for producing the same.

BACKGROUND ART

Magnesium diboride ($MgB_2$) has become a subject of much attention and research worldwide in that it has a superconducting critical transition temperature of 39K beyond the absolute critical temperature (30K) of metallic superconductors in the Bardeen-Cooper-Schrieffer (BCS) theory, for which American physicists John Bardeen, Leon Cooper and John Robert Schrieffer asserted and were awarded the Nobel Prize in Physics in 1972. In addition, this magnesium diboride has advantages over high-temperature oxide superconductors, which are currently much studied, in that it has a very simple structure, is chemically stable, and the raw materials thereof are abundantly present on the earth and smoothly supplied. Furthermore, since magnesium diboride has a superconducting transition temperature of 39K, the temperature thereof can be lowered to a temperature, at which it sufficiently exhibits superconductivity, using an existing electric refrigerator without using liquid helium, and the superconducting critical current density value thereof is measured to be high. Thus, magnesium diboride has a great economic advantage and is used in a very wide range of applications.

However, the critical current density value of magnesium diboride under a magnetic field is too low to be used in practical applications. In particular, magnesium diboride has a problem with low superconducting critical current density properties under a magnetic field, compared to the low-temperature superconducting material NbTi and the high-temperature superconductor YBCO, which are currently commercialized.

Accordingly, there is a need for research on magnesium diboride that can be produced as a superconductor exhibiting improved critical current properties under a magnetic field.

PRIOR ART DOCUMENTS

Patent Documents

Korean Patent No. 10-0493764

DISCLOSURE

Technical Problem

The present disclosure intends to provide a superconductor including magnesium diboride having improved superconducting critical current density properties, and a method for producing the same.

However, problems to be solved by the present disclosure are not limited to the above-mentioned problem, and other problems which are not mentioned will be clearly understood by those skilled in the art from the following description.

Technical Solution

One embodiment of the present disclosure provides a superconductor including: carbon-doped magnesium diboride; and chlorine atoms present in grains of the carbon-doped magnesium diboride.

Another embodiment of the present disclosure provides a method for producing the superconductor, the method including: mixing boron powder with a liquid chlorinated hydrocarbon compound to form an amorphous carbon layer on the surface of the boron powder; mixing magnesium powder with the boron powder having the amorphous carbon layer formed thereon to produce mixture; press shaping the mixture; and sintering a product resulting from the press shaping, wherein the liquid chlorinated hydrocarbon compound is mixed with the boron powder in an amount of 0.03 mL to 0.4 mL per mg of the boron powder.

Advantageous Effects

The superconductor according to one embodiment of the present disclosure has an advantage in that it has a high superconducting critical current density value under a certain magnetic field, and thus has improved superconducting properties.

The method of producing a superconductor according to one embodiment of the present disclosure has an advantage in that it effectively improves the superconducting properties of the produced superconductor by first mixing the boron powder with the liquid chlorinated hydrocarbon compound.

BRIEF DESCRIPTION OF DRAWINGS

FIG. 1 depicts transmission electron microscope (TEM) photographs of boron powder having an amorphous layer formed thereon according to Example 3.

FIG. 2a shows the results of X-ray diffraction (XRD) analysis of superconductors produced in Comparative Example 1, Reference Examples 1 and 2 and Examples 1 to 4, and shows peaks corresponding to the (100) crystal plane and (110) crystal plane of each of the superconductors.

FIG. 2b shows the results of X-ray diffraction (XRD) analysis of superconductors produced in Comparative Example 1, Reference Examples 1 and 2 and Examples 1 to 4, and shows peaks corresponding to the (002) crystal plane of the superconductors.

FIG. 3 shows magnetization-temperature (M-T) curves of superconductors produced in Comparative Example 1, Reference Examples 1 and 2 and Examples 1 to 4.

FIG. 4 shows the superconducting critical current densities of superconductors, produced in Comparative Examples 1 to 3, as a function of magnetic field at a temperature of 5K to 20K.

FIG. 5a shows the superconducting critical current densities of superconductors, produced in Comparative Example 1, Reference Examples 1 and 2 and Examples 1 to 4, as a function of magnetic field at a temperature of 20K.

FIG. 5b shows the superconducting critical current densities of superconductors, produced in Comparative Example 1 and Example 3, as a function of magnetic field at a temperature of 20K.

FIG. 6a shows the superconducting critical current densities of superconductors, produced in Comparative Example 1, Reference Examples 1 and 2 and Examples 1 to 4, as a function of magnetic field at a temperature of 5K.

FIG. 6b shows the superconducting critical current densities of superconductors, produced in Comparative Example 1 and Example 3, as a function of magnetic field at a temperature of 5K.

BEST MODE

The terms used in the present disclosure have been selected from general terms currently widely used in the art, in consideration of their function in the present disclosure, but these terms may have different meanings according to the intention of those skilled in the art, precedents, or the appearance of new technologies. Also, some terms have been arbitrarily selected by the applicant, and in this case, the meaning of the selected terms will be described in detail in the detailed description of the disclosure. Thus, the terms used in the present specification should be construed based on the meanings of the terms, not the simple names of the terms, together with the description throughout the specification.

Throughout the present specification, when any part is referred to as "including" or "comprising" any component, it indicates that the part does not exclude other components, but may further include other components, unless otherwise specified.

In the present specification, the terms "a axis", "b axis", and "c axis" are terms generally known in the art, and each refers to each axis constituting the unit cell according to the Bravais lattice classification.

In the present specification, the term "superconducting critical current density" refers to a value obtained by applying a current to any superconducting material at a certain temperature and under a certain magnetic field and dividing a current value, at which the occurrence of the potential gradient in the material starts, by the cross-sectional area of the material.

In the present specification, the term "superconducting critical transition temperature" means the temperature at which any material transits from a normal state to a superconducting state, as is generally known in the art.

Hereinafter, the present disclosure will be described in more detail.

One embodiment of the present disclosure provides a superconductor including: carbon-doped magnesium diboride; and chlorine atoms present in grains of the carbon-doped magnesium diboride.

In general, the unit cell structure of the magnesium diboride crystal is known as a hexagonal close-packed (HCP) structure. Specifically, the unit cell structure of the magnesium diboride crystal is known as a hexagonal close-packed structure in which boron atoms are provided in a hexagonal shape in the body center of a magnesium atom structure having a hexagonal columnar shape which is hexagonal at the bottom thereof. In addition, it is known that the boron atoms contained in the unit cell of the magnesium diboride crystal can form a tetrahedron with the magnesium atoms adjacent thereto.

According to one embodiment of the present disclosure, the carbon-doped magnesium diboride include one in which at least one of boron atoms constituting the unit cell of magnesium diboride is substituted with a carbon atom, or one in which carbon atoms are present in the grains of magnesium diboride. In addition, the unit cell structure of the carbon-doped magnesium diboride crystal may be a hexagonal close-packed structure.

According to one embodiment of the present disclosure, the superconductor contains chlorine atoms present in the grains of the carbon-doped magnesium diboride.

According to one embodiment of the present disclosure, the chlorine atoms do not constitute the unit cell of the carbon-doped magnesium diboride and may not affect the crystal structure.

The superconductor according to one embodiment of the present disclosure may exhibit an improved critical current density by including the carbon-doped magnesium diboride and chlorine atoms.

According to one embodiment of the present disclosure, the carbon-doped magnesium diboride may contain more than 0 wt. % and not more than 2 wt. %, specifically 0.8 wt. % to 1.9 wt. %, more specifically 1.3 wt. % to 1.7 wt. %, of carbon atoms.

As the superconductor according to one embodiment of the present disclosure includes the carbon-doped magnesium diboride and chlorine atoms, flux pinning may occur due to lattice deformation, lattice defects, stress, etc. of the carbon-doped magnesium diboride crystal. When such flux pinning occurs, the superconductor may exhibit higher superconducting critical current density properties under a certain magnetic field.

According to one embodiment of the present disclosure, the superconductor may contain 0.05 at. % to 0.11 at. %, specifically 0.07 at. % to 0.11 at. %, of chlorine atoms.

The superconductor including: the carbon-doped magnesium diboride containing carbon atoms within the above content range; and chlorine atoms within the above range, may exhibit a more improved critical current density compared to a superconductor including only undoped magnesium diboride, a superconductor including only carbon-doped magnesium diboride, and a superconductor including undoped magnesium diboride and chlorine atoms, at a certain temperature and under a certain magnetic field.

The superconductor according to one embodiment of the present disclosure may be applied to a superconducting wire. The superconducting wire including the superconductor may have excellent electrical conductivity performance compared to a superconducting wire including undoped magnesium diboride. The superconductor may be applied to medical devices such as nuclear magnetic resonance (NMR) devices and magnetic resonance imaging (MRI) devices, superconducting magnetic energy storage devices, and the like.

Another embodiment of the present disclosure provides a method for producing the superconductor, the method including: mixing boron powder with a liquid chlorinated hydrocarbon compound to form an amorphous carbon layer on the surface of the boron powder; mixing magnesium powder with the boron powder having the amorphous carbon layer formed thereon to produce mixture; press shaping the mixture; and sintering a product resulting from the pressing, wherein the liquid chlorinated hydrocarbon compound is mixed with the boron powder in an amount of 0.03 mL to 0.4 mL per mg of the boron powder.

Hereinafter, the production method according to one embodiment of the present disclosure will be described in more detail.

Forming Amorphous Carbon Layer on Surface of Boron Powder

The method for producing a superconductor according to one embodiment of the present disclosure includes mixing boron powder with a liquid chlorinated hydrocarbon compound to form an amorphous carbon layer on the surface of the boron powder. According to the method for producing a superconductor, the liquid chlorinated hydrocarbon compound is mixed with the boron powder in an amount of 0.03 mL to 0.4 mL per mg of the boron powder.

It is known that a liquid carbon-containing material needs to be used in order to uniformly dope magnesium diboride with carbon atoms. Meanwhile, when a solid carbon-containing material is used, it will not be easily mixed with boron at room temperature, and thus should be mixed at a higher temperature. In addition, when the liquid carbon-containing material and boron are mixed at a higher temperature, carbon will be crystallized to form a crystalline graphite layer on the surface of the boron. When the crystalline graphite layer is formed on the surface of boron as described above, boron constituting the unit cell of the magnesium diboride crystal cannot be easily substituted with carbon.

On the other hand, in the method for producing a superconductor according to one embodiment of the present disclosure, the liquid chlorinated hydrocarbon compound is used, and thus the chlorinated hydrocarbon compound and the boron powder may be easily mixed even at room temperature without agglomeration, and an amorphous carbon layer may be formed on the surface of the boron powder. Accordingly, the boron atom in the magnesium diboride crystal can be easily substituted with a carbon atom in the process of producing the carbon-doped magnesium diboride. Accordingly, the boron atom may be blocked from being in contact with external oxygen, contaminants, etc., and thus it is possible to obtain a superconductor prevented from oxidation and organic contamination.

According to one embodiment of the present disclosure, in the method for producing a superconductor, as the liquid chlorinated hydrocarbon compound is used, the mixture of the boron powder and the liquid chlorinated hydrocarbon compound can be prevented from agglomerating, and thus the atoms in the grains of the carbon-doped magnesium diboride can be prevented from being non-uniform. In addition, as the liquid chlorinated hydrocarbon compound is used, a separate solvent cannot be required. Furthermore, the boron powder having the amorphous carbon layer formed on the surface thereof can be formed into a slurry, clay, dough, or the like, and then easily shaped into a desired form.

According to one embodiment of the present disclosure, the chlorinated hydrocarbon compound may include at least one of chloroform and carbon tetrachloride, and specifically, may be chloroform or carbon tetrachloride.

According to one embodiment of the present disclosure, as the amorphous carbon layer formed on the surface of the boron powder is formed by mixing the boron powder and the liquid chlorinated hydrocarbon compound, chlorine atoms may be located inside the boron powder, and amorphous carbon may be coated on the surface of the boron powder to form a shell structure. Specifically, when the mixture of the boron powder and the liquid chlorinated hydrocarbon compound is dried, the inside of the boron powder may be dot-doped with the chlorine constituting the liquid chlorinated hydrocarbon compound, and the carbon constituting the liquid chlorinated hydrocarbon compound may form an amorphous layer on the outside of the boron powder. In addition, the chlorine dot-doped in the boron powder may be present inside the grains of the magnesium diboride in a subsequent process of producing a superconductor. Accordingly, in the subsequent process of producing a superconductor, the boron in the unit cell of the magnesium diboride crystal may be substituted with the carbon contained in the amorphous layer on the outside of the boron powder.

According to one embodiment of the present disclosure, the thickness of the amorphous carbon layer may be 1 nm to 10 nm, 2 nm to 6 nm, or 3 nm to 4 nm. When the thickness of the amorphous carbon layer is within the above thickness range, carbon doping of the magnesium diboride may be easily achieved, and chlorine atoms may be incorporated into the grains of the carbon-doped magnesium diboride. Accordingly, the superconducting properties of the superconductor may be improved.

According to one embodiment of the present disclosure, the liquid chlorinated hydrocarbon compound may be mixed with the boron powder in an amount of 0.03 mL to 0.4 mL, specifically 0.06 mL to 0.2 mL, more specifically 0.09 mL to 0.15 mL, per mg of the boron powder. When the boron powder and the liquid chlorinated hydrocarbon compound are mixed with each other within the above mixing ratio range, it is possible to produce a superconductor having an improved superconducting critical current density value by including the carbon-doped magnesium diboride and chlorine atoms present in the carbon-doped magnesium diboride.

Mixing Magnesium Powder with Boron Powder Having Amorphous Carbon Layer Formed Thereon The method for producing a superconductor according to one embodiment of the present disclosure includes mixing magnesium powder with the boron powder having the amorphous carbon layer formed thereon to produce mixture.

When a superconductor is produced by first mixing boron powder with magnesium powder and then mixing a liquid chlorinated hydrocarbon compound therewith, the chlorinated hydrocarbon compound and the magnesium may react first to form impurities such as magnesium dichloride, because the chlorinated hydrocarbon compound and the magnesium have high reactivity. In this case, since the amount of magnesium that can react with boron decreases and the impurities described above decrease the reactivity between the remaining magnesium and boron, the magnesium diboride may not be sufficiently formed in the superconductor.

In the method of producing a superconductor according to one embodiment of the present disclosure, side reaction during formation of grains of magnesium diboride can be minimized by first mixing boron powder with the liquid chlorinated hydrocarbon compound. Accordingly, uniform doping of magnesium diboride with the chlorinated hydrocarbon compound may be achieved, and superconducting properties of the superconductor may be improved.

According to one embodiment of the present disclosure, the mixing of magnesium powder may comprise mixing the boron powder having the amorphous carbon layer formed thereon with the magnesium powder at a stoichiometric ratio. Specifically, the mixing of magnesium powder may comprise mixing the boron powder having the amorphous carbon layer formed thereon with the magnesium powder at a molar ratio of about 2:1. By mixing as above, it is possible to provide a superconductor including magnesium diboride, specifically carbon-doped magnesium diboride.

According to one embodiment of the present disclosure, the mixing of magnesium powder may comprise mixing boron powder having the amorphous carbon layer formed thereon with the magnesium powder for 30 minutes to 2 hours. Meanwhile, the mixing time is not particularly limited, and the mixing may be performed for a suitable time during which the boron powder having the amorphous carbon layer formed thereon may be uniformly mixed with the magnesium powder.

According to one embodiment of the present disclosure, a product resulting from the mixing of the boron powder having the amorphous carbon layer formed thereon and the magnesium powder may be formed into a slurry, clay, dough, etc., and then easily shaped into a desired form.

Press Shaping Mixture

The method of producing a superconductor according to one embodiment of the present disclosure includes press shaping the mixture.

According to one embodiment of the present disclosure, the mixture may be sealed and stored in a vacuum state until it is pressed.

According to one embodiment of the present disclosure, the press shaping may be performed by applying a pressure of 1,000 MPa to the product resulting from mixing of powder having the amorphous carbon layer formed thereon and the magnesium powder. Meanwhile, the range of the pressure that is applied is not particularly limited, and any pressure selected depending on the amounts of the boron powder, the magnesium powder and the liquid chlorinated hydrocarbon compound may be applied without limitation, as long as it is a pressure at which press shaping is sufficiently possible.

Sintering Product Resulting from Press Shaping

The method of producing a superconductor according to one embodiment of the present disclosure includes sintering the product resulting from the press shaping. When the product resulting from the press shaping is sintered as described above, magnesium, boron, and the carbon and chlorine derived from the chlorinated hydrocarbon compound may be uniformly dispersed and bonded to one another in the superconductor. Specifically, through the sintering, it is possible to produce a superconductor including carbon-doped magnesium diboride and chlorine atoms present in grains of the magnesium diboride. More specifically, when the product resulting from the press shaping is sintered, the magnesium powder may react with the boron powder having the amorphous carbon layer formed thereon, thus forming carbon-doped magnesium diboride containing chlorine atoms in the grains thereof.

According to one embodiment of the present disclosure, the sintering of product resulting from the press shaping may be performed at a temperature of 600° C. to 1,000° C. Specifically, within the above temperature range, magnesium may be melted to form grains of the carbon-doped magnesium diboride, and the already formed grains of carbon-doped magnesium diboride may not be decomposed.

According to one embodiment of the present disclosure, the sintering of product resulting from the press shaping may be performed for 10 minutes to 10 hours. Within the above sintering time range, grains of the carbon-doped magnesium diboride may be sufficiently formed, the amount of impurities such as magnesium oxide in the superconductor may be minimized, and the superconducting cross-sectional area of the grains of the carbon-doped magnesium diboride may be maximized. Meanwhile, the sintering time is not limited to the above range, and may be suitably adjusted according to the temperature range in which the sintering is performed.

According to one embodiment of the present disclosure, the sintering of product resulting from the press shaping may be performed under an inert gas atmosphere. When the product resulting from the press shaping is sintered under an inert gas atmosphere, oxidation of the carbon-doped magnesium diboride may be prevented. In addition, as the inert gas, argon, a mixed gas of argon and hydrogen, or the like, may be used. Specifically, a mixed gas of argon and hydrogen mixed at a volume ratio of 96:4 may be used.

MODE FOR INVENTION

Hereinafter, the present disclosure will be described in detail with reference to examples. However, the examples according to the present disclosure may be modified into various different forms, and the scope of the present disclosure is not interpreted as being limited to the examples described below. The examples of the present specification are provided to more completely explain the present disclosure to those skilled in the art.

Example 1

64 mg of boron powder (O: 0.64 at. %, Cl: 0.04 at. %, and B: 99.32 at. %) having a particle size of about 50 nm and 2 mL of liquid chloroform were mixed with each other to form an amorphous carbon layer on the surface of the boron powder.

The boron powder having the amorphous carbon layer formed thereon and 74 mg (molar ratio of about 2:1) of magnesium powder (purity: about 99%) having a particle size of about 5 μm were mixed with each other for about 30 minutes to produce mixture. The mixture was shaped by applying a pressure of 1,000 MPa thereto, and the product resulting from the press shaping was sintered at a temperature of about 700° C. for 1 hour, thereby producing a superconductor.

Example 2

A superconductor was produced in the same manner as in Example 1, except that the amount of chloroform used was adjusted to 4 mL.

Example 3

A superconductor was produced in the same manner as in Example 1, except that the amount of chloroform used was adjusted to 8 mL.

Example 4

A superconductor was produced in the same manner as in Example 1, except that the amount of chloroform used was adjusted to 12 mL.

Reference Example 1

A superconductor was produced in the same manner as in Example 1, except that the amount of chloroform used was adjusted to 0.5 mL.

Reference Example 2

A superconductor was produced in the same manner as in Example 1, except that the amount of chloroform used was adjusted to 1 mL.

Comparative Example 1

64 mg of boron powder (O: 0.64 at. %, Cl: 0.04 at. %, and B: 99.32 at. %) having a particle size of about 50 nm and 74 mg (molar ratio of about 2:1) of magnesium powder (purity: about 99%) having a particle size of about 5 μm were mixed with each other for about 30 minutes to produce mixture. The mixture was shaped by applying a pressure of 1,000 MPa thereto, and the product resulting from the press shaping was sintered at a temperature of about 700° C. for 1 hour, thereby producing a superconductor.

Comparative Example 2

64 mg of boron powder (O: 0.64 at. %, Cl: 0.04 at. %, and B: 99.32 at. %) having a particle size of about 50 nm and 74 mg (molar ratio of about 2:1) of magnesium powder (purity: about 99%) having a particle size of about 5 μm were mixed with each other for about 30 minutes to produce mixture. The mixture was mixed with 0.1 mL of liquid chloroform.

Then, the product resulting from the mixing was shaped by applying a pressure of 1,000 MPa thereto, and the product resulting from the press shaping was sintered at a temperature of about 700° C. for 1 hour, thereby producing a superconductor.

Comparative Example 3

A superconductor was produced in the same manner as in Comparative Example 2, except that the amount of chloroform used was adjusted to 1 mL.

[Experimental Example 1]—Transmission Electron Microscopy

Two samples were prepared using the boron powder having the amorphous layer formed thereon, obtained according to Example 3. The samples were photographed with an aberration corrected field emission transmission electron microscope (JEM-2100F, JEL Ltd.), and the results are shown in FIG. 1.

Through FIG. 1, it could be seen that the amorphous carbon layer was formed on the surface of the boron powder. At this time, the thickness of the amorphous carbon layer formed on the outside of the boron powder was 3 nm to 4 nm (FIG. 1(a)), or 2 nm to 6 nm (FIG. 1(b)).

[Experimental Example 2]—Element Analysis

The content of each of carbon and chlorine atoms in the superconductors produced in Comparative Example 1, Reference Examples 1 and 2 and Examples 1 to 4 was measured using each of an element analyzer (CS 744, Leco) and an EDS (Energy Dispersive X-ray Spectrometer) attached to FE-SEM (Field Emission Scanning Electron Microscope, MIRA3 LM), and the results are shown in Table 1 below.

TABLE 1

| Example No. | Measured value of carbon content (wt. %) | Estimated value of doped carbon content (wt. %) | Measured value of chlorine content (at. %) | Estimated value of chlorine content (at. %) in grains |
|---|---|---|---|---|
| Comparative Example 1 | 0.51 | — | 0.06 | — |
| Reference Example 1 | 0.52 | 0.01 | 0.08 | 0.02 |
| Reference Example 2 | 0.53 | 0.02 | 0.07 | 0.01 |
| Example 1 | 0.84 | 0.33 | 0.11 | 0.05 |
| Example 2 | 1.34 | 0.83 | 0.13 | 0.07 |
| Example 3 | 1.68 | 1.17 | 0.16 | 0.09 |
| Example 4 | 1.86 | 1.35 | 0.17 | 0.11 |

In Table 1 above, it can be seen that there was no significant difference between the carbon content of the superconductor produced in Comparative Example 1, in which no chloroform was used, and the carbon content of the superconductor produced in each of Reference Examples 1 and 2. The carbon content of the superconductor produced in Comparative Example 1 can be considered to be attributable to impurities introduced in the process of producing the superconductor, or contamination generated in the process of measuring the carbon content using the elemental analyzer. Thus, it can be considered that, in the case of the superconductors produced in Reference Example 1 and Reference Example 2, the magnesium diboride was doped with little or no carbon.

In Table 1 above, in the case of the superconductors produced in Examples 1 to 4 in which the amount of chloroform used was included within the range according to one embodiment of the present disclosure, the magnesium diboride can be considered to be doped with carbon, and it can be seen that, as the amount of chloroform used increased, the amount of carbon doping also increased to a certain level.

In Table 1 above, it can be seen that chlorine atoms were detected even in the superconductor produced in Comparative Example 1 in which no chloroform was used. This can be considered to be attributable to impurities introduced in the process of producing the superconductor, or contamination generated in the process of measuring the chlorine content using the EDS. That is, the content of chlorine present in the grains of the magnesium diboride in the superconductor containing chlorine atoms can be estimated as a value obtained by subtracting the chlorine content, measured in the superconductor produced in Comparative Example 1, from the measured content. In addition, in Table 1 above, it can be seen that, in the case of the superconductors produced in Reference Examples 1 and 2 and Examples 1 to 4, the chlorine content increased as the amount of chloroform used increased.

Taking the above results together, it can be seen that the superconductors produced in Reference Examples 1 to 2 included undoped magnesium diboride and chlorine atoms present in the grains of the magnesium diboride. In addition, it can be seen that the superconductors produced in Examples 1 to 4 included carbon-doped magnesium diboride and chlorine atoms present in the grains of the magnesium diboride.

[Experimental Example 3]—XRD Analysis

For the superconductors produced in Comparative Example 1, Reference Examples 1 and 2 and Examples 1 to 4, XRD analysis (measurement system: D/MAX-2500V/PO, Rigaku; measurement condition: Cu-K$_\alpha$ ray) was performed, and the results are shown in FIGS. 2a and 2b. Specifically, FIG. 2a shows peaks corresponding to the (100) and (110) crystal planes of each of the superconductors, and FIG. 2b shows peaks corresponding to the (002) plane of each of the superconductors.

Referring to FIG. 2a, it can be seen that the diffraction angles of the (100) and (110) crystal planes of each of the superconductors produced in Examples 1 to 4 were shifted. Also, referring to FIG. 2b, it can be seen that the diffraction angle of the (002) crystal plane of each of the superconductors produced in Examples 1 to 4 was not shifted.

In addition, the a-axis length and c-axis length of the unit cell of the magnesium diboride crystal in each of the superconductors produced in Comparative Example 1, Reference Examples 1 and 2 and Examples 1 to 4, and the ratio of the lengths, were measured using the results of XRD analysis, and the results are shown in Table 2 below.

TABLE 2

| Example No. | a-axis length (Å) | c-axis length (Å) | c-axis length/ a-axis length |
|---|---|---|---|
| Comparative Example 1 | 3.0830 | 3.5246 | 1.14324 |
| Reference Example 1 | 3.0824 | 3.5230 | 1.14294 |
| Reference Example 2 | 3.0824 | 3.5238 | 1.14320 |
| Example 1 | 3.0814 | 3.5254 | 1.14409 |
| Example 2 | 3.0763 | 3.5229 | 1.14517 |
| Example 3 | 3.0744 | 3.5246 | 1.14644 |
| Example 4 | 3.0714 | 3.5238 | 1.14729 |

According to Bragg's law, as the diffraction angle value increases, the distance between atoms constituting the unit cell of the crystal decreases.

In Table 2 above, it can be seen that as the amount of chloroform used increased, the a-axis length of the unit cell of the carbon-doped magnesium diboride crystal decreased, but the c-axis length thereof did not almost change. Accordingly, it can be seen that the boron atoms constituting the unit cell of the carbon-doped magnesium diboride crystal included in each of the superconductors produced in Examples 1 to 4 were substituted with carbon atoms.

[Experimental Example 4]—Analysis of Superconducting Critical Temperature

Using the VSM (Vibrating Sample Magnetometer) mode of Physical Property Measurement System (PPMS®) (Quantum Design Inc.), the magnetization intensity of each of the superconductors produced in Comparative Example 1, Reference Examples 1 and 2 and Examples 1 to 4 was measured as a function of temperature, and the results are shown as M-T (Magnetization-Temperature) curves in FIG. 3. The superconducting critical transition temperatures calculated based on the results are shown in Table 3 below.

TABLE 3

| Example No. | Superconducting critical transition temperature (K) |
|---|---|
| Comparative Example 1 | 37.50 |
| Reference Example 1 | 37.74 |
| Reference Example 2 | 37.65 |
| Example 1 | 36.79 |
| Example 2 | 35.84 |
| Example 3 | 35.35 |
| Example 4 | 34.75 |

In Table 3 above, it can be seen that the superconducting critical transition temperatures of the superconductors produced in Reference Examples 1 and 2, in which the amount of chloroform used was below the lower limit of the range according to one embodiment of the present disclosure, were 37.74K and 37.65K, respectively, which were almost similar to the superconducting critical transition temperature (37.50K) of the superconductor of Comparative Example 1, which included undoped magnesium diboride.

Meanwhile, in Table 3 above, it can be seen that the superconducting critical transition temperatures of the superconductors produced in Examples 1 to 4, in which the amount of chloroform used was included within the range according to one embodiment of the present disclosure, were somewhat lower than the superconducting critical transition temperatures of the superconductors produced in Comparative Example 1 and Reference Examples 1 and 2.

Through this, it can be seen that, in the superconductors produced in Examples 1 to 4, the magnesium diboride was doped with carbon in addition to chlorine atoms. That is, it can be seen that, in the case of the superconductors of Reference Examples 1 and 2 in which the amount of chloroform used was below the lower limit of the range according to one embodiment of the present disclosure, only chlorine atoms were incorporated in the grains and did not affect the superconducting critical transition temperatures of the superconductors, but in the case of the superconductors of Examples 1 to 4 in which the amount of chloroform used was included within the range according to one embodiment of the present disclosure, the superconducting critical transition temperatures of the superconductors were affected by doping with carbon atoms.

[Experimental Example 5]—Measurement of Superconducting Critical Current Density The magnetization intensity versus magnetic field measured using the VSM (Vibrating Sample Magnetometer) mode of Physical Property Measurement System (PPMS®) (Quantum Design Inc.) was converted to the critical current density versus magnetic field using the Bean's Model, thereby measuring the critical current density values of the superconductors produced in Comparative Examples 1 to 3, Reference Examples 1 and 2 and Examples 1 to 4.

FIG. 4 shows the superconducting critical current density versus magnetic field of each of the superconductors produced in Comparative Examples 1 to 3. Referring to FIG. 4, it could be confirmed that the superconductors produced in Comparative Examples 2 and 3 generally showed lower superconducting critical current densities than the superconductor (Comparative Example 1) including undoped magnesium diboride, at temperatures of 5K and 20K and under the same magnetic field. Through this, it can be seen that the superconductor, produced by first mixing the boron powder and the magnesium powder, and then mixing the liquid chlorinated hydrocarbon compound therewith, had a lower critical current density than the superconductor including undoped magnesium diboride.

FIG. 5a shows the critical current densities of the superconductors, produced in Comparative Example 1, Reference Examples 1 and 2 and Examples 1 to 4, as a function of a magnetic field at a temperature of 20K, and FIG. 5b shows the critical current densities of the superconductors, produced in Example 3 and Comparative Example 1, as a function of a magnetic field at a temperature of 20K. Referring to FIG. 5a, it can be seen that the superconductors produced in Examples 1 to 4 had higher critical current densities than the superconductors, produced in Comparative Example 1 and Reference Examples 1 and 2, at a temperature of 20K and under a magnetic field of 6 T. In particular, it can be seen that the superconductor produced in Example 3 had the highest critical current density. That is, referring to FIG. 5b, it can be seen that the superconductor produced in Example 3 had an about 12-fold higher critical current density than the superconductor, produced in Comparative Example 1, at temperature of 20K and a magnetic field of 6 T.

FIG. 6a shows the critical current densities of the superconductors, produced in Comparative Example 1, Reference Examples 1 and 2 and Examples 1 to 4, as a function of a magnetic field at a temperature of 5K, and FIG. 6b shows the critical current densities of the superconductors, produced in Example 3 and Comparative Example 1, as a function of a magnetic field at a temperature of 5K. Referring to FIG. 6a, it can be seen that the superconductors produced in Examples 1 to 4 had higher critical current densities than the superconductors, produced in Comparative Example 1 and Reference Examples 1 and 2, at a temperature of 5K and under a magnetic field of 8 T. In particular, it can be seen that the superconductor produced in Example 3 had the highest critical current density. That is, referring to FIG. 6b, it can be seen that the superconductor produced in Example 3 had an about 7-fold higher critical current density than the superconductor, produced in Comparative Example 1, at temperature of 5K and a magnetic field of 8 T.

Through this, it can be seen that the superconductor according to one embodiment of the present disclosure has improved superconducting properties compared to a superconductor including only undoped magnesium diboride, and a superconductor including chlorine atoms and undoped magnesium diboride.

The invention claimed is:

1. A superconductor comprising: carbon-doped magnesium diboride; and chlorine atoms present in grains of the carbon-doped magnesium diboride, wherein the superconductor comprises 0.05 at. % to 0.11 at. % of chlorine atoms.

2. The superconductor of claim 1, wherein the carbon-doped magnesium diboride comprises more than 0 wt. % and 2 wt. % or less of carbon atoms.

3. A method for producing the superconductor according to claim 1, the method comprising:
   mixing boron powder with a liquid chlorinated hydrocarbon compound to form an amorphous carbon layer on the surface of the boron powder;
   mixing magnesium powder with the boron powder having the amorphous carbon layer formed thereon to produce mixture;
   press shaping the mixture; and
   sintering a product resulting from the press shaping,
   wherein the liquid chlorinated hydrocarbon compound is mixed with the boron powder in an amount of 0.03 mL to 0.4 mL per mg of the boron powder.

4. The method of claim 3, wherein the liquid chlorinated hydrocarbon compound is chloroform or carbon tetrachloride.

5. The method of claim 3, wherein the mixing of magnesium powder comprises mixing the magnesium powder with the boron powder having the amorphous carbon layer formed thereon at a stoichiometric ratio.

6. The method of claim 3, wherein the amorphous carbon layer has a thickness of 1 nm to 10 nm.

7. The method of claim 3, wherein the sintering is performed at a temperature of 600° C. to 1,000° C.

8. The method of claim 3, wherein the sintering is performed for 10 minutes to 10 hours.

* * * * *